(12) United States Patent
Hatanaka et al.

(10) Patent No.: US 6,687,650 B2
(45) Date of Patent: Feb. 3, 2004

(54) INDOOR ENVIRONMENT DESIGN SYSTEM, INDOOR ENVIRONMENT EVALUATION SYSTEM, INDOOR ENVIRONMENT DESIGN METHOD, AND INDOOR ENVIRONMENT EVALUATION METHOD

(75) Inventors: Hideyuki Hatanaka, Chiba (JP); Masato Ohtsubo, Yotsukaido (JP); Sadaaki Arikawa, Chiba (JP)

(73) Assignee: Nitto Boseki Co., Ltd., Fukushima (JP)

( * ) Notice: Subject to any disclaimer, the term of this patent is extended or adjusted under 35 U.S.C. 154(b) by 339 days.

(21) Appl. No.: 09/873,443

(22) Filed: Jun. 5, 2001

(65) Prior Publication Data

US 2002/0023244 A1 Feb. 21, 2002

(30) Foreign Application Priority Data

Jun. 5, 2000 (JP) .................................. P2000-167651

(51) Int. Cl.$^7$ .......................... G06F 11/00; G21C 17/00
(52) U.S. Cl. ............... 702/182; 455/575.1; 174/35 MS
(58) Field of Search ............................. 702/57, 65–66, 702/69, 124, 126, 182, 189; 455/456.1, 456.2, 456.4, 575.1, 575.8, 115.1–115.3, 226.1, 300–301, 347, 349; 174/35 MS; 307/91

(56) References Cited

U.S. PATENT DOCUMENTS

| | | | | |
|---|---|---|---|---|
| 4,975,926 A | * | 12/1990 | Knapp | 375/141 |
| 5,276,277 A | * | 1/1994 | Hightower et al. | 174/35 MS |
| 5,496,966 A | * | 3/1996 | Hightower et al. | 174/35 MS |
| 5,507,035 A | * | 4/1996 | Bantz et al. | 455/133 |
| 5,577,265 A | * | 11/1996 | Wheatley, III | 370/335 |
| 5,689,812 A | * | 11/1997 | Takahashi | 455/67.16 |
| 5,697,063 A | * | 12/1997 | Kishigami et al. | 455/507 |
| 5,903,834 A | * | 5/1999 | Wallstedt et al. | 455/422.1 |
| 6,034,987 A | * | 3/2000 | Chennakeshu et al. | 375/133 |
| 6,084,928 A | * | 7/2000 | Kuwahara | 375/347 |
| 6,088,582 A | * | 7/2000 | Canora et al. | 455/226.1 |
| 6,119,009 A | * | 9/2000 | Baranger et al. | 455/446 |

OTHER PUBLICATIONS

Kato et al., "Measurements of millimeter wave indoor propagation and high–speed digital transmission characteristics at 60 GHz", Sep. 1–4, 1997, Personal, Indoor and Mobile Radio Communications, IEEE International Symposium, vol. 1, pp. 149–154.*

Huang et al., "Delay spreads and channel dynamics measurements at ISM bands", Jun. 14–18, 1992, Communications, 1992 IEEE International Conference, vol. 3, pp. 1222–1226.*

Shih–Hon et al., "SBR/image approach for radio wave propagation in furnished environments", Jul. 21–26, 1996, Antennas and Propagation Society International Symposium, vol. 1, pp. 453–456.*

Shih–Hon et al., "All SBR/image approach to indoor radio propagation modeling", Jun. 18–23, 1995, Antennas and Propagation Society International Symposium, vol. 4, pp. 1952–1955.*

* cited by examiner

Primary Examiner—Marc S. Hoff
Assistant Examiner—Mary Catherine Baran
(74) Attorney, Agent, or Firm—Morgan, Lewis & Bockius LLP

(57) ABSTRACT

An indoor environment design system 10 is composed of a target communication quality input section 12 for inputting a target communication quality of radio communication in a room, a signal propagation property calculation section 14 for calculating a delay spread in the room for implementation of the target communication quality, a signal propagation property conversion section 16 for converting the delay spread in the room thus calculated, to a delay spread in a laboratory, and an indoor environment design section 18 for designing an environment in the room for radio communication, based on the delay spread in the laboratory thus converted and on a relation between delay spreads in the laboratory and environments in the laboratory for implementation of the delay spreads in the laboratory, which is preliminarily obtained experimentally.

14 Claims, 9 Drawing Sheets

INDOOR ENVIRONMENT DESIGN SYSTEM, INDOOR ENVIRONMENT EVALUATION SYSTEM, INDOOR ENVIRONMENT DESIGN METHOD, AND INDOOR ENVIRONMENT EVALUATION METHOD

BACKGROUND OF THE INVENTION

1. Field of the Invention

The present invention relates to an indoor environment design system and an indoor environment design method for designing an environment in a room for radio communication and to an indoor environment evaluation system and an indoor environment evaluation method for evaluating an environment in a room for radio communication.

2. Related Background Art

In the information-oriented society in these days, preparation of telecommunication infrastructure such as LAN is essential matter for designing indoor environments in offices and the like. Among others, wireless LAN using the radio communication is drawing attention recently for the reasons of capability of greatly reducing wiring in office, relative easiness of movement and addition of terminal unit, and so on. In conjunction therewith, there are increasing needs for design of indoor environment for radio communication.

As a technique of designing an indoor environment for radio communication, there is a method of actually constructing a model of an indoor space intended to implement radio communication (a building model) by architecture CAD, performing an electromagnetic wave (EM) propagation property simulation (three-dimensional ray tracing) in the model of indoor space thus constructed, and designing an indoor environment for radio communication, based on the result of the simulation.

SUMMARY OF THE INVENTION

However, the indoor environment design method according to the above prior art had the problem discussed below. Namely, according to the indoor environment design of the foregoing prior art, the model of indoor space for radio communication is actually constructed using the architecture CAD, the EM propagation property simulation is performed in the model of indoor space thus constructed, and the indoor environment for radio communication is designed based on the result of the simulation. Accordingly, every time another indoor space actually intended to effect radio communication has a different state (size or the like), another indoor space model has to be constructed for that space by architecture CAD and the EM propagation property simulation has to be performed in the indoor space model thus constructed. Therefore, an extremely long time becomes necessary for design of an indoor environment.

On the other hand, at sites of actual business discussions and the like to present designs, proposals, etc. of indoor environment, it is not always necessary to provide the result of detailed EM propagation property simulation for each indoor space to be designed and it is rather often important to speedily design an indoor environment achieving a desired communication quality. It is also important similarly to speedily evaluate an environment in a designed room.

The present invention has been accomplished to solve the above problem and it is thus an object of the present invention to provide an indoor environment design system and an indoor environment design method that can speedily design an environment in a room for radio communication and to provide an indoor environment evaluation system and an indoor environment evaluation method that can speedily evaluate an environment in a room for radio communication.

For accomplishing the above object, an indoor environment design system of the present invention is an indoor environment design system for designing an environment in a room for radio communication, which comprises: target communication quality input means for inputting a target communication quality of the radio communication in the room; first signal propagation property calculation means for calculating a signal propagation property in the room for implementation of the target communication quality, based on the target communication quality inputted by the target communication quality input means; first signal propagation property conversion means for converting the signal propagation property in the room calculated by the first signal propagation property calculation means, to a signal propagation property in a laboratory of a specific size; and indoor environment design means for designing the environment in the room, based on the signal propagation property in the laboratory converted by the first signal propagation property conversion means and on a relation between signal propagation properties in the laboratory and environments in the laboratory for implementation of the signal propagation properties in the laboratory, which is preliminarily obtained experimentally.

An indoor environment design method of the present invention is an indoor environment design method of designing an environment in a room for radio communication, which comprises: a target communication quality input step of inputting a target communication quality of the radio communication in the room; a first signal propagation property calculation step of calculating a signal propagation property in the room for implementation of the target communication quality, based on the target communication quality inputted in the target communication quality input step; a first signal propagation property conversion step of converting the signal propagation property in the room calculated in the first signal propagation property calculation step, to a signal propagation property in a laboratory of a specific size; and an indoor environment design step of designing the environment in the room, based on the signal propagation property in the laboratory converted in the first signal propagation property conversion step and on a relation between signal propagation properties in the laboratory and environments in the laboratory for implementation of the signal propagation properties in the laboratory, which is preliminarily obtained experimentally.

The relation is preliminarily determined experimentally between signal propagation properties in the laboratory of the specific size and environments in the laboratory for implementation of the signal propagation properties in the laboratory, the signal propagation property in the room as a design object is converted to the signal propagation property in the laboratory, and the environment in the room is designed based on the signal propagation property thus converted and on the relation between signal propagation properties in the laboratory and environments in the laboratory for implementation of the signal propagation properties in the laboratory, which was preliminarily obtained experimentally as above; whereby, even for another indoor space having a different state (size or the like), there becomes no need for execution of an electromagnetic wave propagation property simulation every time for the indoor space. As a result, it becomes feasible to speedily design the environment in the room for radio communication.

For accomplishing the above object, an indoor environment evaluation system of the present invention is an indoor environment evaluation system for evaluating an environment in a room for radio communication, which comprises: indoor environment input means for inputting the environment in the room; second signal propagation property calculation means for calculating a signal propagation property in a laboratory of an environment corresponding to the environment in the room inputted by the indoor environment input means, based on a relation between environments in the laboratory of a specific size and signal propagation properties in the laboratory, which is preliminarily obtained experimentally; second signal propagation property conversion means for converting the signal propagation property in the laboratory calculated by the second signal propagation property calculation means, to a signal propagation property in the room; and indoor environment evaluation means for evaluating the environment in the room for the radio communication, based on the signal propagation property in the room converted by the second signal propagation property conversion means.

For accomplishing the above object, an indoor environment evaluation method of the present invention is an indoor environment evaluation method of evaluating an environment in a room for radio communication, which comprises: an indoor environment input step of inputting the environment in the room; a second signal propagation property calculation step of calculating a signal propagation property in a laboratory of an environment corresponding to the environment in the room inputted in the indoor environment input step, based on a relation between environments in the laboratory of a specific size and signal propagation properties in the laboratory, which is preliminarily obtained experimentally; a second signal propagation property conversion step of converting the signal propagation property in the laboratory calculated in the second signal propagation property calculation step, to a signal propagation property in the room; and an indoor environment evaluation step of evaluating the environment in the room for the radio communication, based on the signal propagation property in the room converted in the second signal propagation property conversion step.

The relation is preliminarily obtained experimentally between environments in the laboratory of the specific size and signal propagation properties in the laboratory, the signal propagation property in the laboratory of the environment corresponding to the environment in the room is calculated based on the relation between environments in the laboratory and signal propagation properties in the laboratory, the signal propagation property in the laboratory thus calculated is converted to the signal propagation property in the room, and the environment in the room for radio communication is evaluated based on the signal propagation property in the room thus converted; whereby, even for another indoor space having a different state (size or the like), there is no need for execution of an electromagnetic wave propagation property simulation every time for the indoor space. As a result, it becomes feasible to speedily evaluate the environment in the room for radio communication.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
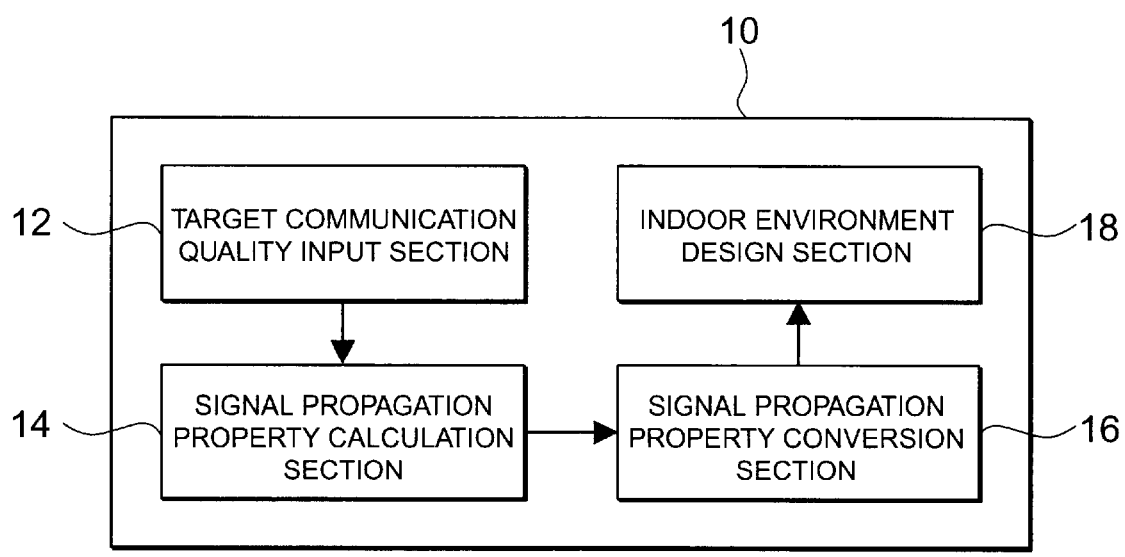
FIG. 1 is a block diagram of an indoor environment design system.

An indoor environment design system according to an embodiment of the present invention will be described with reference to the drawings. First described is the structure of the indoor environment design system according to the present embodiment. FIG. 1 is a block diagram of the indoor environment design system according to the present embodiment.

The indoor environment design system 10 of the present embodiment is an indoor environment design system for designing an environment in a room for radio communication and, as shown in FIG. 1, is composed of a target communication quality input section 12 (target communication quality input means), a signal propagation property calculation section 14 (first signal propagation property calculation means), a signal propagation property conversion section 16 (first signal propagation property conversion means), and an indoor environment design section 18 (indoor environment design means). Each of the components will be described below in detail.

The target communication quality input section 12 inputs a target communication quality of radio communication in a room as a design object. More specifically, the target communication quality input section 12 inputs a data transfer rate and an average bit error rate as the target communication quality of radio communication.

Here the data transfer rate denotes the number of bits of data that can be transferred in one second. For example, the data transfer rate of 2 Mbps means that data of two million bits can be transferred in every period of one second. The average bit error rate is a quantity indicating at a rate of one error (one bit) to how many bits there occur transmission errors during transmission of digital signals. For example, the average bit error rate of $10^{-3}$ means that transfer errors occur at the rate of one error (one bit) to 1000 bits on average.

The signal propagation property calculation section 14 calculates a signal propagation property in the room of interest for implementation of the target communication quality, based on the foregoing target communication quality inputted by the target communication quality input section 12. In this case, a delay spread during radio communication in the foregoing room can be applied as the signal propagation property in the room.

Here the delay spread σ is a quantity defined by Eq (1) to Eq (3) below.

$$\sigma_m = \sqrt{\frac{1}{Pm}\int_{t_0}^{t_1} t^2 f(t)dt - T_D^2} \quad (1)$$

$$T_D = \frac{1}{Pm}\int_{t_0}^{t_1}(t-t_0)f(t)dt \quad (2)$$

$$Pm = \int_{t_0}^{t_1} f(t)dt \quad (3)$$

In these equations, f(t) is a power delay profile. The power delay profile f(t) is a temporal change of received power level at a receiving antenna under circumstances where a transmitting antenna transmits a radio wave in the form of an impulse, the radio wave is reflected on the walls, floor, ceiling, etc. in the room to propagate through multiple paths, and thereafter waves arrive at the receiving antenna. Further, to represents a time when the power delay profile f (t) first exceeds a noise level $L_0$, and $t_1$ a time when the power delay profile f(t) last falls below the noise level $L_0$. Here Pm indicates a received power and $T_D$ an average delay. The delay spread being large means that a temporal dispersion width of multipath reflected waves is large, which is a disadvantageous condition for high-speed radio communication.

Figure 2:
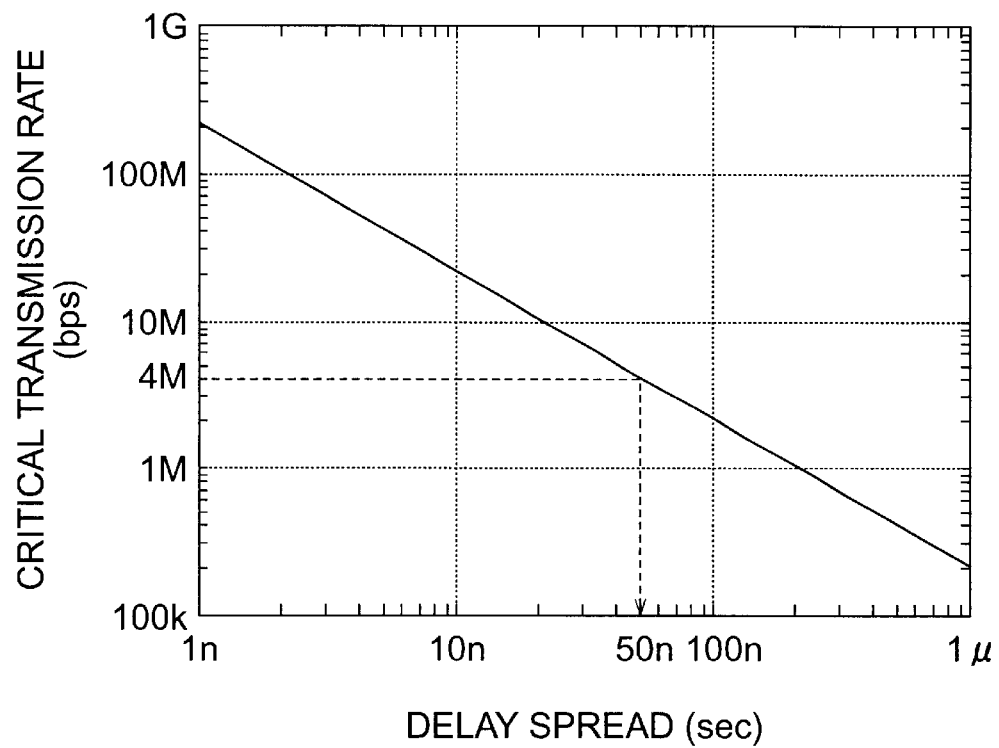
FIG. 2 is a diagram showing a relation between delay spread and critical transmission rate.

More specifically, the signal propagation property calculation section 14 calculates (tolerance of) the delay spread for implementation of the data transfer rate as a target, using the relation between delay spread and critical transmission rate as shown in FIG. 2. Here the critical transmission rate is a transmission speed at which transmission can be implemented at the average bit error rate of $10^{-3}$. The relation between delay spread σ and critical transmission rate Rc is given by Eq (4) below.

$$\sigma = 10^{(-\log Rc + 2.30)} \quad (4)$$

The coefficient (2.30) in the exponent of above Eq (4) varies depending upon a ratio between an average power of scattered waves and a power of a direct wave, but in communication in standard indoor spaces, the ratio between the average power of scattered waves and the power of the direct wave is approximately −6 dB and the foregoing coefficient can be set to 2.30 in this case.

The relation between delay spread and critical transmission rate is determined for every average bit error rate. Accordingly, the signal propagation property calculation section 14 calculates the delay spread for implementation of the data transfer rate as a target, using the relation between delay spread and critical transmission rate at the average bit error rate as a target.

The signal propagation property conversion section 16 converts the delay spread in the room, thus calculated by the signal propagation property calculation section 14, to a signal propagation property in a laboratory of a specific size. A delay spread during radio communication in the foregoing laboratory can be applied as the signal propagation property in the laboratory. Describing in more detail, the signal propagation property conversion section 16 converts the delay spread in the room to the delay spread in the laboratory, based on a ratio (comparison) between the size of the space in the room and the size of the space in the laboratory. Since heights of indoor spaces (e.g., rooms in office buildings) being objects of design are standardized to some extent in practice, the height of the space in the laboratory can be set to the height thus standardized. Therefore, the ratio between the size of the space in the room and the size of the space in the laboratory becomes substantially equal to a ratio between a floor area of the space in the room and a floor area of the space in the laboratory. Accordingly, the signal propagation property conversion section 16 converts the delay spread in the room to the delay spread in the laboratory, based on Eq (5) below.

$$\sigma_m = \sqrt{\frac{S_m}{S_r}} \times \sigma_r \quad (5)$$

In this equation, $\sigma_r$ represents the delay spread in the room, $\sigma_m$ the delay spread in the laboratory, $S_r$ the floor area of the space in the room, and $S_m$ the floor area of the space in the laboratory.

Figure 3:
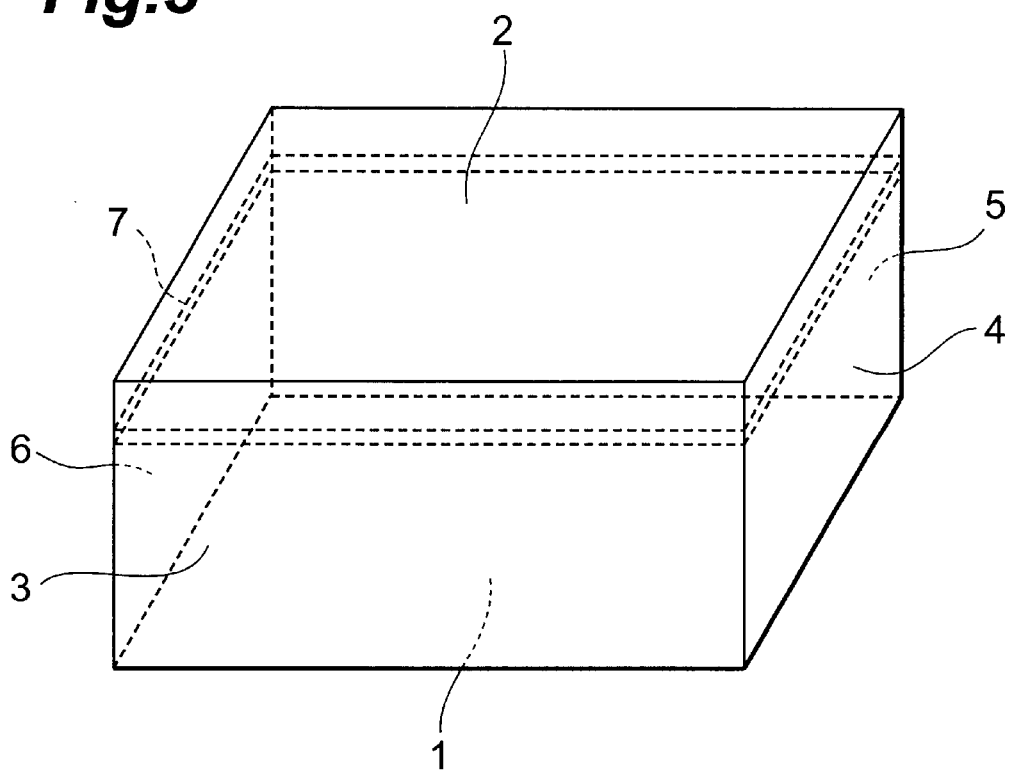
FIG. 3 is a view showing the structure of a space in a room and in a laboratory.
Figure 4:
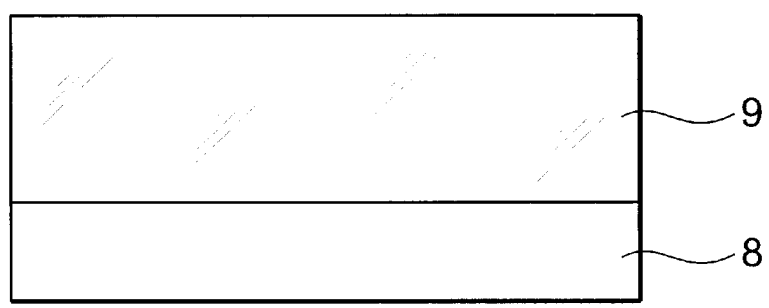
FIG. 4 is a view showing the structure of a wall surface having a spandrel wall.
Figure 5:
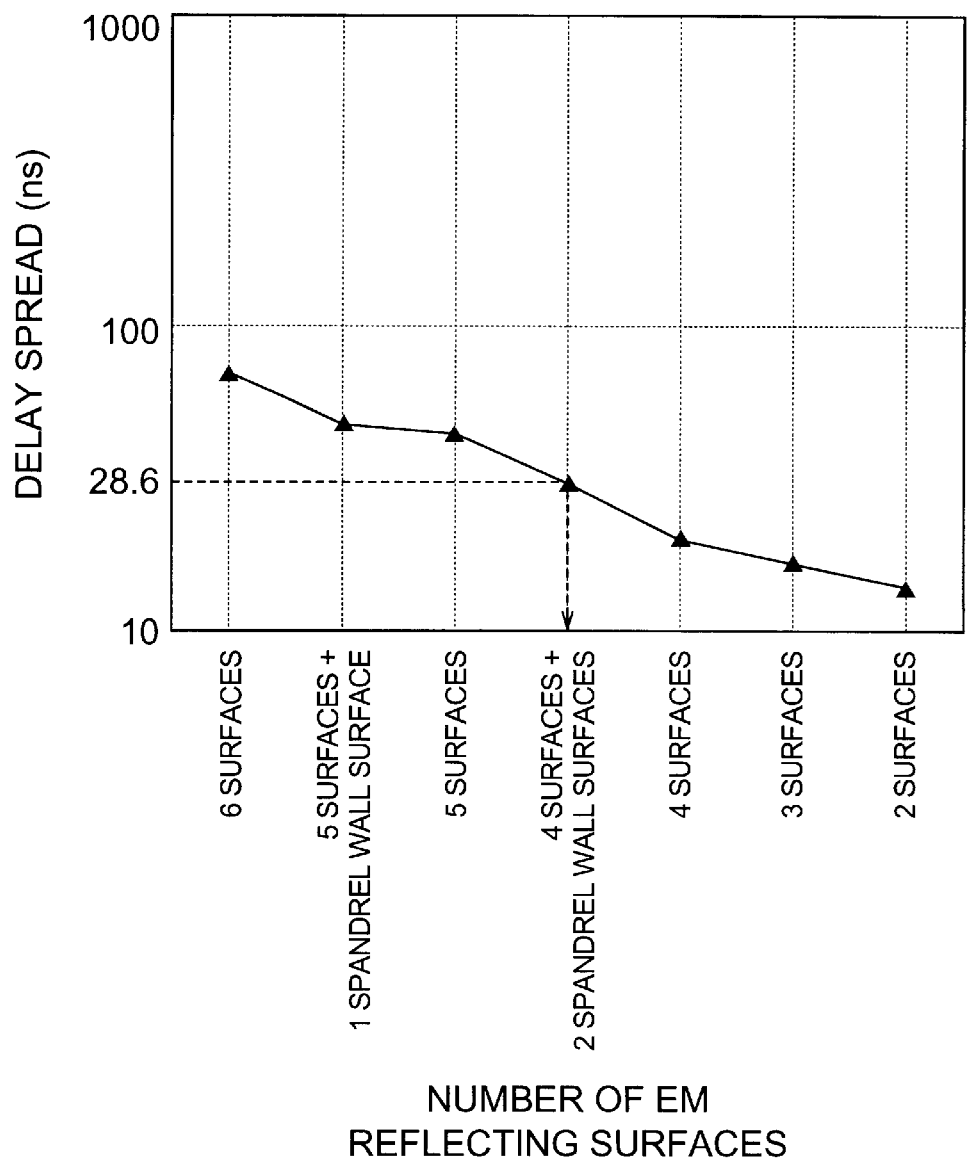
FIG. 5 is a diagram showing a relation between numbers of EM reflecting surfaces and delay spreads.

The indoor environment design section 18 designs the environment in the room, based on the delay spread in the laboratory, thus converted by the signal propagation property conversion section 16, and a relation between delay spreads in the laboratory and environments in the laboratory for implementation of delay spreads in the laboratory, which was preliminarily obtained experimentally. Here the environment in the room to be designed is a layout pattern of EM absorbing surfaces or EM reflecting surfaces in the room, and the environment in the laboratory a layout pattern of EM absorbing surfaces or EM reflecting surfaces in the laboratory. Namely, the indoor environment design section 18 determines which surface should be an EM absorbing surface and which surface should be an EM reflecting surface in a room of rectangular parallelepiped shape separated from the outside by a floor surface 1, a ceiling surface 2, and four wall surfaces 3, 4, 5, 6 as shown in FIG. 3. Here an EM reflecting surface is a surface on which the reflectance of EM in the wavelength band used in radio communication is not less than 80%, and an EM absorbing surface is a surface on which the reflectance of EM in the wavelength band used in radio communication is not more than 40%. When the floor surface 1, ceiling surface 2, and four wall surfaces 3, 4, 5, 6 all are constructed of EM reflecting surfaces, the construction cost becomes inexpensive, but the delay spread becomes large enough to degrade the communication quality. On the other hand, when the floor surface 1, ceiling surface 2, and four wall surfaces 3, 4, 5, 6 all are constructed of EM absorbing surfaces, the delay spread becomes small to enhance the communication quality, but the construction cost becomes high. Accordingly, the indoor environment design section 18 determines the number of EM reflecting surfaces (or the number of EM absorbing surfaces) that can be taken for implementation of the target communication quality. In the room a ceiling board 7 is provided a fixed distance apart from the ceiling surface 2, as shown in FIG. 3. Concerning the four wall surfaces 3, 4, 5, 6, consideration may be given, not only to cases where each wall surface is entirely an EM reflecting surface or an EM absorbing surface, but also to cases where a part of each surface to a certain distance from the floor surface 1 is a spandrel wall surface 8 serving as an EM reflecting surface or an EM absorbing surface and the rest part is a window glass surface 9 serving as an EM absorbing surface, as shown in FIG. 4. The indoor environment design section 18 designs the environment in the room, specifically, as follows. Namely, the indoor environment design section 18 calculates the number of EM reflecting surfaces (or the number of EM absorbing surfaces) in the laboratory for implementation of the delay spread in the laboratory converted by the signal propagation property conversion section 16, using the relation between delay spreads in the laboratory and numbers of EM reflecting surfaces (or numbers of EM absorbing surfaces) in the laboratory for implementation of delay spreads in the laboratory, which was preliminarily obtained experimentally as shown in FIG. 5. Further, the indoor environment design section 18 designs the environment in the room, using the number of EM reflecting surfaces (or the number of EM absorbing surfaces) thus calculated, as the number of EM reflecting surfaces (or the number of EM absorbing surfaces) in the actual room. Here the space in the laboratory and the space in the room are different only in their floor area as to the size. Namely, the spaces have the same height, and the ceiling board 7 is located at the same position and made of the same material. In FIG. 5, "6 surfaces" as the number of EM reflecting surfaces indicates that all the floor surface 1, ceiling surface 2, and four wall surfaces 3, 4, 5, 6 are EM reflecting surfaces. Further, "5 surfaces+1 spandrel wall surface" as the number of EM reflecting surfaces indicates that the floor surface 1 and ceiling surface 2 are EM reflecting surfaces, three surfaces out of the four wall surfaces 3, 4, 5, 6 are EM reflecting surfaces, the rest wall surface includes a spandrel wall surface 8, and the spandrel wall surface 8 is an EM reflecting surface. "5 surfaces" as the number of EM reflecting surfaces indicates that the floor surface 1 and ceiling surface 2 are EM reflecting surfaces, three surfaces out of the four wall surfaces 3, 4, 5, 6 are EM reflecting surfaces, and the rest wall surface is an EM absorbing surface. "4 surfaces +2 spandrel wall surfaces" as the number of EM reflecting surfaces indicates that the floor surface 1 and ceiling surface 2 are EM reflecting surfaces, two surfaces out of the four wall surfaces 3, 4, 5, 6 are EM reflecting surfaces, the two rest wall surfaces include their respective spandrel wall surfaces 8, and the spandrel wall surfaces 8 are EM reflecting surfaces. "4 surfaces" as the number of EM reflecting surfaces indicates that the floor surface 1 and ceiling surface 2 are EM reflecting surfaces, two surfaces out of the four wall surfaces 3, 4, 5, 6 are EM reflecting surfaces, and the two other wall surfaces are EM absorbing surfaces. "3 surfaces" as the number of EM reflecting surfaces indicates that the floor surface 1 and ceiling surface 2 are EM reflecting surfaces, one surface out of the four wall surfaces 3, 4, 5, 6 is an EM reflecting surface, and the three other wall surfaces are EM absorbing surfaces. "2 surfaces" as the number of EM reflecting surfaces indicates that the floor surface 1 and ceiling surface 2 are EM reflecting surfaces and the four wall surfaces 3, 4, 5, 6 are EM absorbing surfaces.

Figure 6:
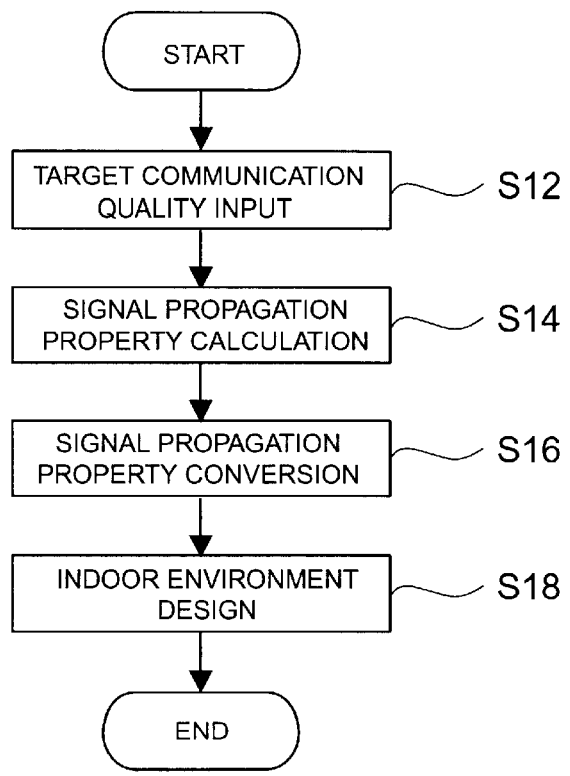
FIG. 6 is a flowchart showing the operation of the indoor environment design system.

The operation of the indoor environment design system according to the present embodiment will be described below and in conjunction therewith, an indoor environment design method according to an embodiment of the present invention will be described. FIG. 6 is a flowchart showing the operation of the indoor environment design system 10 according to the present embodiment. The operation here will be described more specifically with numerals below. Namely, the size of the space in the room as an object of design is 8.5 m×10.5 m (=89.25 m$^2$) in the size of the floor surface 1 and 2.5 m in height. Among the wall surfaces 3, 4, 5, 6 of the space in the room as an object of design, two surfaces include their respective spandrel walls. The ceiling board 7 of the space in the room as an object of design is located 1.2 m apart from the ceiling surface 2 and the ceiling board 7 is an EM absorbing surface. On the other hand, the size of the space in the laboratory is 5.3 m×5.5 m (=29.15 m$^2$) in the size of the floor surface 1 and 2.5 m in height. The ceiling board 7 of the space in the laboratory is located 1.2 m apart from the ceiling surface 2 and the ceiling board 7 is an EM absorbing surface. The relation between numbers of EM reflecting surfaces and delay spreads in the space in the laboratory is preliminarily obtained by experiment, as shown in FIG. 5.

For designing the environment in the room by use of the indoor environment design system 10 according to the present embodiment, as shown in FIG. 6, the target communication quality of radio communication in the room as an object of design is first inputted from the target communication quality input section 12 (S12). More specifically, the data transfer rate and average bit error rate are inputted as the target communication quality of radio communication. Let us suppose here that the data transfer rate input is 4 Mbps (or higher) and the average bit error rate input is $10^{-3}$ (or lower).

Receiving the input of the target communication quality, the signal propagation property calculation section 14 calculates the signal propagation property in the room for implementation of the target communication quality (S14), based on the target communication quality inputted by the target communication quality input section 12. Here the delay spread during radio communication in the room is applied as the signal propagation property in the room. More specifically, using the relation between delay spread and critical transmission rate as shown in FIG. 2, the calculation section 14 calculates (tolerance of) the delay spread for implementation of the data transfer rate as a target. Here the relation between delay spread $\sigma$ and critical transmission rate Rc is given by aforementioned Eq (4). FIG. 2 shows the relation between delay spread and critical transmission rate at the average bit error rate of not more than $10^{-3}$. According to FIG. 2, (tolerance of) the delay spread in the room for implementation of the data transfer rate of not less than 4 Mbps is 50 ns.

After the delay spread in the room is calculated, as shown in FIG. 6, the signal propagation property conversion section 16 converts the delay spread in the room, calculated by the signal propagation property calculation section 14, to a signal propagation property in the laboratory of the specific size (S16). The delay spread during radio communication in the laboratory is applied as the signal propagation property in the laboratory. Describing in more detail, the delay spread in the room is converted to the delay spread in the laboratory, based on the ratio (comparison) between the size of the space in the room and the size of the space in the laboratory. Since indoor spaces (e.g., rooms in office buildings) as objects of design are standardized to some extent in practice, the height of the space in the laboratory is also set to the standardized height. Therefore, the ratio between the size of the space in the room and the size of the space in the laboratory becomes substantially equal to the ratio of the floor area of the space in the room and the floor area of the space in the laboratory. Accordingly, the conversion from the delay spread in the room to the delay spread in the laboratory is performed based on aforementioned Eq (5). Since the conditions here are that the delay spread $\sigma_r$ in the room is 50 ns, the floor area $S_r$ of the space in the room 89.25 m², and the floor area $S_m$ of the space in the laboratory 29.15 m², the delay spread $\sigma_m$ in the laboratory is calculated as 28.6 ns according to aforementioned Eq (5).

After the delay spread in the room is converted to the delay spread in the laboratory, the indoor environment design section 18 designs the environment in the room (S18), based on the delay spread in the laboratory converted by the signal propagation property conversion section 16 and on the relation between delay spreads in the laboratory and environments in the laboratory for implementation of delay spreads in the laboratory, which was preliminarily obtained by experiment. The environment in the room to be designed here is a layout pattern of EM absorbing surfaces or EM reflecting surfaces in the room, and the design section 18 determines which surface should be an EM absorbing surface and which surface an EM reflecting surface in the indoor environment in the room of rectangular parallelepiped shape separated from the outside by the floor surface 1, ceiling surface 2, and four wall surfaces 3, 4, 5, 6 as shown in FIG. 3. The environment in the laboratory is a layout pattern of EM absorbing surfaces or EM reflecting surfaces in the laboratory. Specifically, the environment in the room is designed as follows. Namely, the design section 18 first calculates the number of EM reflecting surfaces (or the number of EM absorbing surfaces) in the laboratory for implementation of the delay spread in the laboratory converted by the signal propagation property conversion section 16, using the relation between delay spreads in the laboratory and numbers of EM reflecting surfaces (or numbers of EM absorbing surfaces) in the laboratory for implementation of delay spreads in the laboratory, preliminarily obtained by experiment as shown in FIG. 5. Further, the environment in the room is designed by regarding the number of EM reflecting surfaces (or the number of EM absorbing surfaces) thus calculated, as the number of EM reflecting surfaces (or the number of EM absorbing surfaces) in the actual room. Since the delay spread in the laboratory converted by the signal propagation property conversion section 16 is 28.6 ns herein, the number of EM reflecting surfaces in the laboratory for implementation of the delay spread is calculated as 4 surfaces+2 spandrel wall surfaces from FIG. 5. As a result, the number of EM reflecting surfaces in the room for implementation of the target communication quality (the data transfer rate of not less than 4 Mbps and the average bit error rate of not more than $10^{-3}$) is also designed to be 4 surfaces+2 spandrel wall surfaces. Since two surfaces out of the wall surfaces 3, 4, 5, 6 of the space in the room as an object of design include their respective spandrel walls as described above, there is no need for construction and the like of changing either of the wall surfaces 3, 4, 5, 6 to an EM absorbing surface in order to achieve the target communication quality. If none of the wall surfaces 3, 4, 5, 6 of the space in the room as an object of design includes a spandrel wall, or if only one surface out of the wall surfaces 3, 4, 5, 6 includes a spandrel wall, it is necessary to perform construction of changing either one of the wall surfaces 3, 4, 5, 6 to an EM absorbing surface, in order to enable implementation of the target communication quality.

In the next place, the action and effect of the indoor environment design system according to the present embodiment will be described. The indoor environment design system 10 according to the present embodiment is configured to preliminarily experimentally obtain the relation between signal propagation properties (specifically, delay spreads) in the laboratory of the specific size and environments (specifically, numbers of EM reflecting surfaces) in the laboratory for implementation of the signal propagation properties in the laboratory, convert the signal propagation property in the room as a design object to the signal propagation property in the laboratory, and design the environment in the room, based on the thus converted signal propagation property and on the foregoing relation between signal propagation properties in the laboratory and environments in the laboratory for implementation of the signal propagation properties in the laboratory, preliminarily obtained experimentally. Accordingly, even if another indoor space has a different state (size or the like), there is no need for execution of the EM propagation property simulation every time for the indoor space. As a result, it becomes feasible to speedily design the environment in the room for radio communication.

The indoor environment design system 10 according to the present embodiment can design the environment in the room for radio communication with high accuracy by using as the foregoing signal propagation property the delay spread being an extremely important parameter that dominates the communication quality of radio communication in the room. As a result, the reliability of the indoor environment design system 10 is enhanced.

The indoor environment design system 10 according to the present embodiment can efficiently design the environment in the room for radio communication by employing as the environment in the room to be designed, the number of EM reflecting surfaces (or EM absorbing surfaces) that greatly affects the communication quality of radio communication in the indoor space. As a result, the expediency of the indoor environment design system 10 is enhanced.

The indoor environment design system 10 according to the present embodiment converts the signal propagation property in the room to the signal propagation property in the laboratory, using the ratio between the size of the space in the room and the size of the space in the laboratory (more practically, the ratio of floor areas), whereby the system can readily perform such conversion. As a result, it becomes feasible to design the environment in the room for radio communication more speedily.

Figure 7:
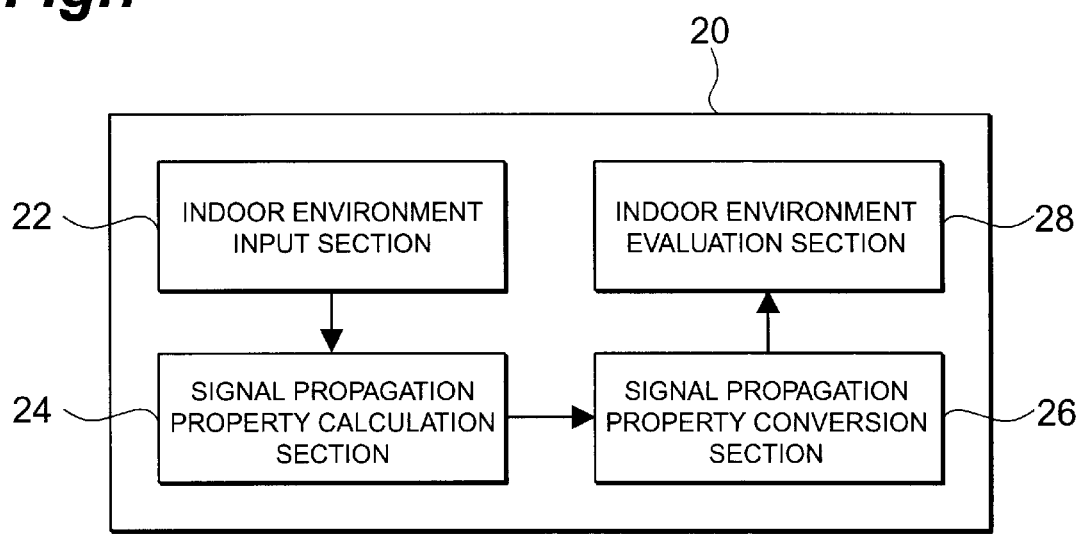
FIG. 7 is a block diagram of an indoor environment evaluation system.

In the next place, an indoor environment evaluation system according to an embodiment of the present invention will be described below with reference to the drawings. First described is the structure of the indoor environment evaluation system according to the present embodiment. FIG. 7 is a block diagram of the indoor environment evaluation system according to the present embodiment.

The indoor environment evaluation system 20 according to the present embodiment is an indoor environment evaluation system for evaluating an environment in a room for radio communication and, as shown in FIG. 7, is composed of an indoor environment input section 22 (indoor environment input means), a signal propagation property calculation section 24 (second signal propagation property calculation means), a signal propagation property conversion section 26 (second signal propagation property conversion means), and an indoor environment evaluation section 28 (indoor environment evaluation means). Each of the components will be described below in detail.

The indoor environment input section 22 inputs an environment in a room as an object of evaluation. Here the environment in the room to be inputted is a layout pattern of EM absorbing surfaces or EM reflecting surfaces in the room. More specifically, the indoor environment input section 22 inputs the number of EM reflecting surfaces (or the number of EM absorbing surfaces) in the room of rectangular parallelepiped shape separated from the outside by the floor surface 1, ceiling surface 2, and four wall surfaces 3, 4, 5, 6 as shown in FIG. 3. Namely, when the floor surface 1, ceiling surface 2, and four wall surfaces 3, 4, 5, 6 all are EM reflecting surfaces, the number of EM reflecting surfaces is 6. When the floor surface 1 and ceiling surface 2 are EM reflecting surfaces and three, two, or one out of the four wall surfaces 3, 4, 5, 6 is an EM reflecting surface, the number of EM reflecting surfaces is 5, 4, or 3, respectively. When the floor surface 1 and ceiling surface 2 are EM reflecting surfaces and neither of the four wall surfaces 3, 4, 5, 6 is an EM reflecting surface, the number of EM reflecting surfaces is 2. For convenience' sake, the surfaces except for the EM reflecting surfaces are considered to be EM absorbing surfaces herein. In cases where either of the wall surfaces has a spandrel wall as shown in FIG. 4 and the spandrel wall surface 8 is an EM reflecting surface, the number of EM go reflecting surfaces is 5 surfaces+1 spandrel wall surface, 4 surfaces+2 spandrel wall surfaces, and so on.

Figure 8:
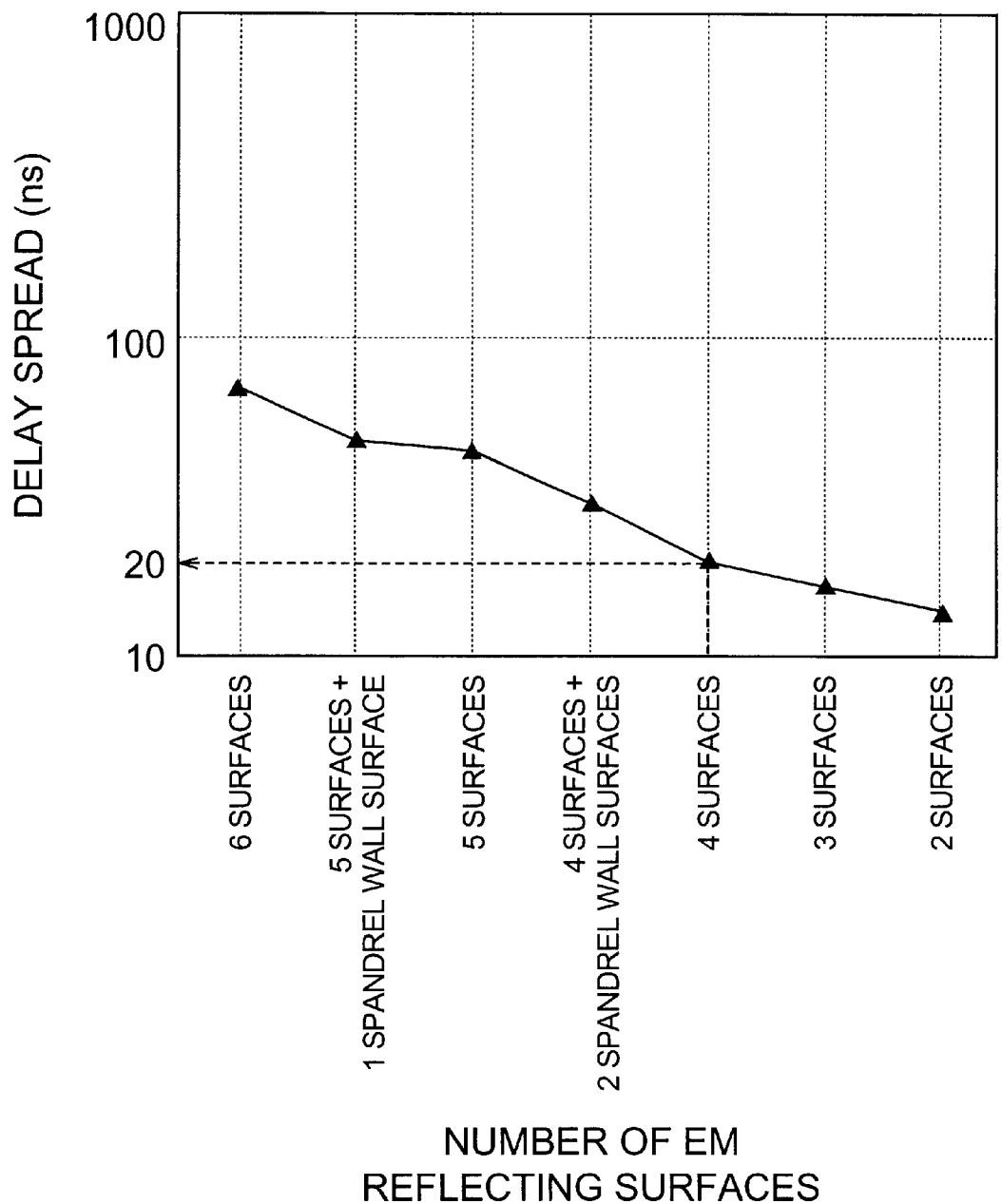
FIG. 8 is a diagram showing a relation between numbers of EM reflecting surfaces and delay spreads.

The signal propagation property calculation section 24 calculates the signal propagation property in the laboratory of an environment corresponding to the environment in the room inputted by the indoor environment input section 22, based on a relation between environments in the laboratory of the specific size and signal propagation properties in the laboratory, which was preliminarily obtained experimentally. In this case, the delay spread during radio communication in the room is applied as the signal propagation property in the room, and the delay spread during radio communication in the laboratory as the signal propagation property in the laboratory. More specifically, the signal propagation property calculation section 24 calculates the delay spread in the laboratory having the number of EM reflecting surfaces (or the number of EM absorbing surfaces) equivalent to (or equal to) the number of EM reflecting surfaces (or the number of EM absorbing surfaces) inputted by the indoor environment input section 22, using a relation between numbers of EM reflecting surfaces (or numbers of EM absorbing surfaces) in the laboratory and delay spreads in the laboratory, which was preliminarily obtained experimentally, as shown in FIG. 8. Here the space in the laboratory and the space in the room are different only in their floor area as to the size. Namely, the spaces have the same height, and the ceiling board 7 is located at the same position and made of the same material. In FIG. 8, "6 surfaces" as the number of EM reflecting surfaces indicates that all the floor surface 1, ceiling surface 2, and four wall surfaces 3, 4, 5, 6 are EM reflecting surfaces. Further, "5 surfaces+1 spandrel wall surface" as the number of EM reflecting surfaces indicates that the floor surface 1 and ceiling surface 2 are EM reflecting surfaces, three surfaces out of the four wall surfaces 3, 4, 5, 6 are EM reflecting surfaces, the rest wall surface includes a spandrel wall surface 8, and the spandrel wall surface 8 is an EM reflecting surface. "5 surfaces" as the number of EM reflecting surfaces indicates that the floor surface 1 and ceiling surface 2 are EM reflecting surfaces, three surfaces out of the four wall surfaces 3, 4, 5, 6 are EM reflecting surfaces, and the rest wall surface is an EM absorbing surface. "4 surfaces+2 spandrel wall surfaces" as the number of EM reflecting surfaces indicates that the floor surface 1 and ceiling surface 2 are EM reflecting surfaces, two surfaces out of the four wall surfaces 3, 4, 5, 6 are EM reflecting surfaces, the two rest wall surfaces include their respective spandrel wall surfaces 8, and the spandrel wall surfaces 8 are EM reflecting surfaces. "4 surfaces" as the number of EM reflecting surfaces indicates that the floor surface 1 and ceiling surface 2 are EM reflecting surfaces, two surfaces out of the four wall surfaces 3, 4, 5, 6 are EM reflecting surfaces, and the two other wall surfaces are EM absorbing surfaces. "3 surfaces" as the number of EM reflecting surfaces indicates that the floor surface 1 and ceiling surface 2 are EM reflecting surfaces, one surface out of the four wall surfaces 3, 4, 5, 6 is an EM reflecting surface, and the three other wall surfaces are EM absorbing surfaces. "2 surfaces" as the number of EM reflecting surfaces indicates that the floor surface 1 and ceiling surface 2 are EM reflecting surfaces and the four wall surfaces 3, 4, 5, 6 are EM absorbing surfaces.

The signal propagation property conversion section 26 converts the delay spread in the laboratory, calculated by the signal propagation property calculation section 24, to the delay spread in the room. Describing in more detail, the signal propagation property conversion section 26 converts the delay spread in the laboratory to the delay spread in the room, based on the ratio (comparison) between the size of the space in the room and the size of the space in the laboratory. Since heights of indoor spaces (e.g., rooms in office buildings) being objects of design are standardized to some extent in practice, the height of the space in the laboratory can be set to the height thus standardized. Therefore, the ratio between the size of the space in the room and the size of the space in the laboratory becomes substantially equal to the ratio of the floor area of the space in the room and the floor area of the space in the laboratory. Accordingly, the signal propagation property conversion section 26 converts the delay spread in the laboratory to the delay spread in the room, based on Eq (6) below.

$$\sigma_r = \sqrt{\frac{S_r}{S_m}} \times \sigma_m \tag{6}$$

In this equation, $\sigma_r$ represents the delay spread in the room, $\sigma_m$ the delay spread in the laboratory, $S_r$ the floor area of the space in the room, and $S_m$ the floor area of the space in the laboratory.

Figure 9:
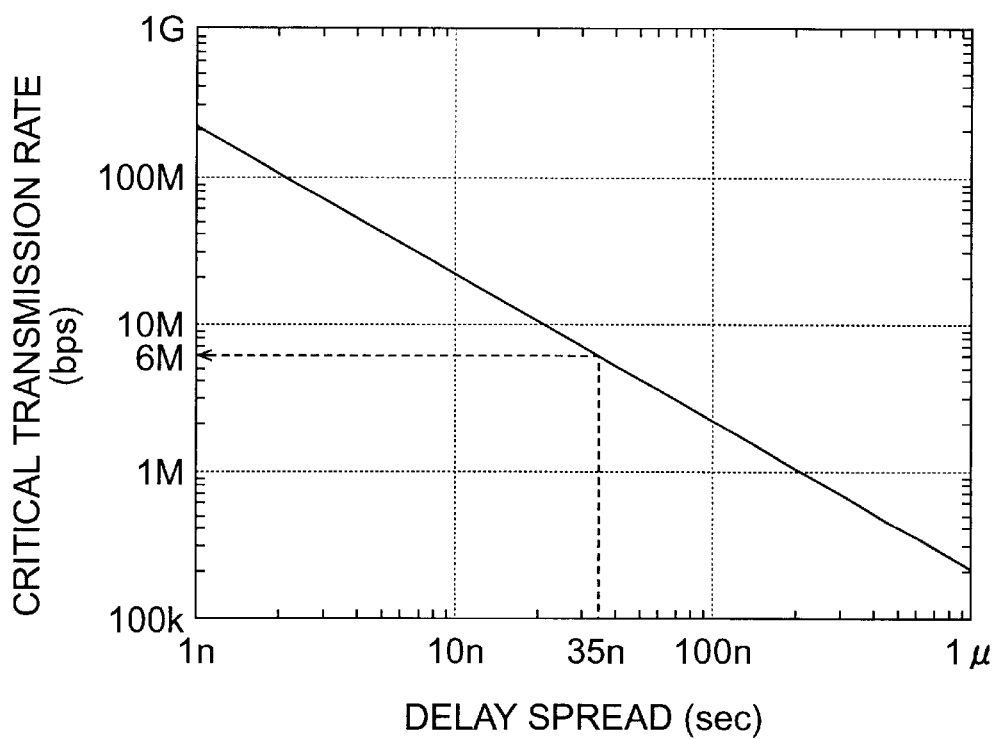
FIG. 9 is a diagram showing a relation between delay spread and critical transmission rate.

The indoor environment evaluation section 28 evaluates the environment in the room for radio communication, based on the delay spread in the room converted by the signal propagation property conversion section 26. Describing in more detail, the indoor environment evaluation section 28 evaluates the environment in the room by calculating a communication quality that can be implemented in the room. Here the communication quality can be a data transfer rate at a fixed average bit error rate. Specifically, the indoor environment evaluation section 28 calculates a data transfer rate being a communication quality implementable in the room, using the relation between delay spread $\sigma$ and critical transmission rate Rc as shown in FIG. 9. The relation between delay spread $\sigma$ and critical transmission rate Rc is given by Eq (7) below.

$$Rc = 10^{(-\log\sigma + 2.30)} \tag{7}$$

The coefficient (2.30) in the exponent of above Eq (7) varies depending upon the ratio between the average power of the scattered waves and the power of the direct wave, but in communication in standard indoor space, the ratio between the average power of the scattered waves and the power of the direct wave is approximately −6 dB and the foregoing coefficient can be set to 2.30 in this case.

The relation between delay spread and critical transmission rate is determined for every average bit error rate.

Accordingly, the indoor environment evaluation section 28 calculates the data transfer rate at the average bit error rate, using the relation between delay spread and critical transmission rate at the allowed average bit error rate.

Figure 10:
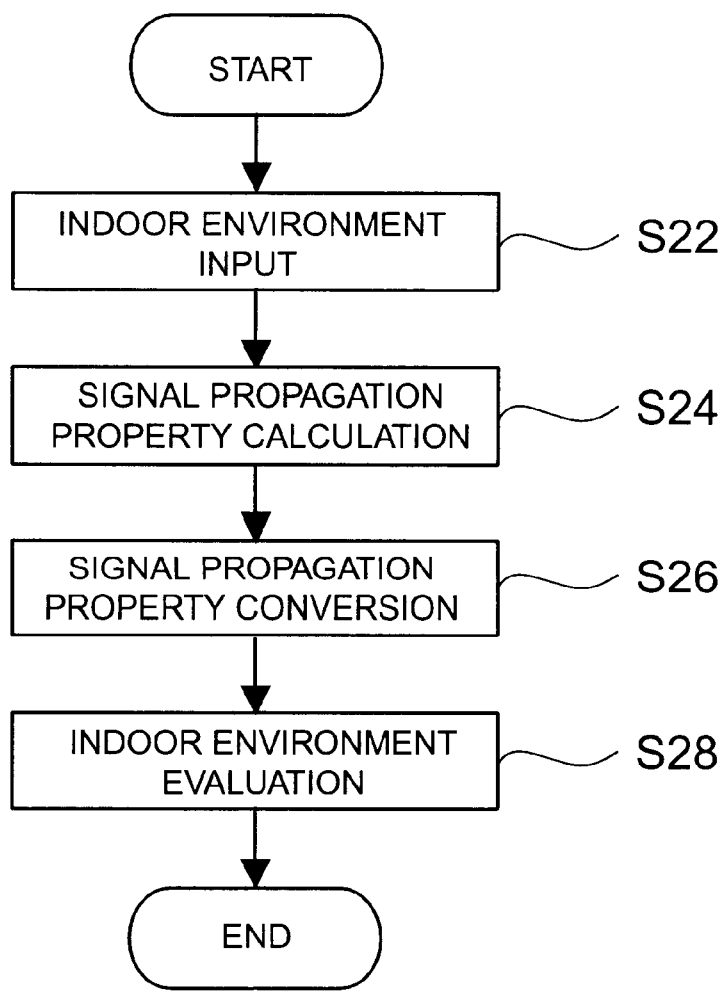
FIG. 10 is a flowchart showing the operation of the indoor environment evaluation system.

The operation of the indoor environment evaluation system according to the present embodiment will be described below and in conjunction therewith, an indoor environment evaluation method according to an embodiment of the present invention will be described. FIG. 10 is a flowchart showing the operation of the indoor environment evaluation system 20 according to the present embodiment. The operation here will be described more specifically with numerals below. Namely, the size of the space in the room as an object of evaluation is 8.5 m×10.5 m (=89.25 m²) in the size of the floor surface 1 and 2.5 m in height. The floor surface 1 and ceiling surface 2 of the space in the room as an object of evaluation are EM reflecting surfaces and two surfaces out of the four wall surfaces 3, 4, 5, 6 are EM reflecting surfaces. The two other surfaces out of the four wall surfaces 3, 4, 5, 6 are EM absorbing surfaces. Therefore, the space in the room as an object of evaluation has the four EM reflecting surfaces. The ceiling board 7 of the space in the room as an object of evaluation is located 1.2 m apart from the ceiling surface 2 and the ceiling board 7 is an EM absorbing surface. On the other hand, the size of the space in the laboratory is 5.3 m×5.5 m (=29.15 m²) in the size of the floor surface 1 and 2.5 m in height. The ceiling board 7 of the space in the laboratory is located 1.2 m apart from the ceiling surface 2 and the ceiling board 7 is an EM absorbing surface. The relation between numbers of EM reflecting surfaces and delay spreads in the space in the laboratory is preliminarily obtained by experiment, as shown in FIG. 8.

For evaluating the environment in the room by use of the indoor environment evaluation system 20 according to the present embodiment, as shown in FIG. 10, the indoor environment input section 22 first inputs the environment in the room as an object of evaluation (S22). The environment in the room to be inputted herein is a layout pattern of EM reflecting surfaces (or EM absorbing surfaces) in the room of interest. More specifically, the input section 22 inputs the number of EM reflecting surfaces in the room of rectangular parallelepiped shape separated from the outside by the floor surface 1, ceiling surface 2, and four wall surfaces 3, 4, 5, 6 as shown in FIG. 3. At this stage the input section 22 inputs the number of EM reflecting surfaces being four, as the environment in the room.

Receiving the environment in the room as an object of evaluation, the signal propagation property calculation section 24 calculates the signal propagation property in the laboratory of the environment corresponding to the environment in the room inputted by the indoor environment input section 22 (S24), based on the relation between environments in the laboratory of the specific size and signal propagation properties in the laboratory, which was preliminarily obtained experimentally. In this case, the delay spread during radio communication in the room is applied as the signal propagation property in the room, and the delay spread during radio communication in the laboratory as the signal propagation property in the laboratory. More specifically, the calculation section 24 calculates the delay spread in the laboratory having the number of EM reflecting surfaces (or the number of EM absorbing surfaces) equivalent to (or equal to) the number of EM reflecting surfaces (or the number of EM absorbing surfaces) inputted by the indoor environment input section 22, using the relation between numbers of EM reflecting surfaces (or numbers of EM absorbing surfaces) in the laboratory and delay spreads in the laboratory, which was preliminarily obtained experimentally as shown in FIG. 8. Since the number of EM reflecting surfaces inputted by the indoor environment input section 22 is 4 surfaces herein, the delay spread in the laboratory is calculated as 20 ns from FIG. 8.

After the delay spread in the laboratory is calculated, the signal propagation property conversion section 26 converts the delay spread in the laboratory calculated by the signal propagation property calculation section 24, to the delay spread in the room (S26). Describing in more detail, the delay spread in the laboratory is converted to the delay spread in the room, based on the ratio (comparison) between the size of the space in the room and the size of the space in the laboratory. Since indoor spaces (e.g., rooms in office buildings) as objects of design are standardized to some extent in practice, the height of the space in the laboratory is also set to the standardized height. Therefore, the ratio between the size of the space in the room and the size of the space in the laboratory becomes substantially equal to the ratio between the floor area of the space in the room and the floor area of the space in the laboratory. Accordingly, the conversion from the delay spread in the laboratory to the delay spread in the room is performed based on aforementioned Eq (6). Since the conditions here are that the delay spread $\sigma_m$ in the laboratory is 20 ns, the floor area $S_r$ of the space in the room 89.25 m², and the floor area $S_m$ of the space in the laboratory 29.15 m², the delay spread $\sigma_r$ in the room is calculated as 35 ns according to aforementioned Eq (6).

After the delay spread in the laboratory is converted to the delay spread in the room, the indoor environment evaluation section 28 evaluates the environment in the room for radio communication (S28), based on the delay spread in the room converted by the signal propagation property conversion section 26. Describing in more detail, the environment in the room is evaluated by calculating the communication quality implementable in the room. The data transfer rate at the fixed average bit error rate is applied as the communication quality herein. Specifically, the data transfer rate as the communication quality implementable in the room is calculated, using the relation between delay spread σ and critical transmission rate Rc as shown in FIG. 9. Here the relation between delay spread σ and critical transmission rate Rc is represented by foregoing Eq (7). FIG. 9 shows the relation between delay spread σ nd critical transmission rate at the average bit error rate of not more than $10^{-3}$ From FIG. 9, the room can be evaluated so that when the delay spread in the room is 35 ns, the data transfer rates up to 6 Mbps can be implemented at the average bit error rate of not more than $10^{-3}$.

In the next place, the action and effect of the indoor environment evaluation system according to the present embodiment will be described below. The indoor environment evaluation system 20 according to the present embodiment is configured to preliminarily experimentally obtain the relation between environments in the laboratory of the specific size (specifically, the number of EM reflecting surfaces) and signal propagation properties in the laboratory (specifically, delay spreads), calculate the signal propagation property in the laboratory of the environment corresponding to the environment of the room, based on the relation between environments in the laboratory and signal propagation properties in the laboratory, convert the signal propagation property in the laboratory calculated, to the signal propagation property in the room, and evaluate the environment in the room for radio communication, based on the signal propagation property in the room thus converted.

Accordingly, even if another indoor space has a different state (size or the like), there is no need for execution of the EM propagation property simulation every time for the indoor space. As a result, it becomes feasible to speedily evaluate the environment in the room for radio communication.

The indoor environment evaluation system 20 according to the present embodiment can evaluate the environment in the room for radio communication with high accuracy by using as the foregoing signal propagation property the delay spread being an extremely important parameter that dominates the communication quality of radio communication in the room. As a result, the reliability of the indoor environment evaluation system 20 is enhanced.

The indoor environment evaluation system 20 according to the present embodiment can evaluate the environment in the room for radio communication with high accuracy by inputting as the environment in the room to be evaluated, the number of EM reflecting surfaces (or EM absorbing surfaces) that greatly affects the communication quality of radio communication in the indoor space. As a result, the expediency of the indoor environment design evaluation 20 is enhanced.

The indoor environment evaluation system 20 according to the present embodiment converts the signal propagation property in the room to the signal propagation property in the laboratory, using the ratio between the size of the space in the room and the size of the space in the laboratory (more practically, the ratio of floor areas), whereby the system can readily perform such conversion. As a result, it becomes feasible to evaluate the environment in the room for radio communication more speedily.

Since the indoor environment evaluation system 20 according to the present embodiment calculates the communication quality as evaluation, it can quantify the environment in the room extremely clearly. As a result, it becomes feasible to readily grasp the evaluation of the environment in the room for radio communication.

Figure 11:
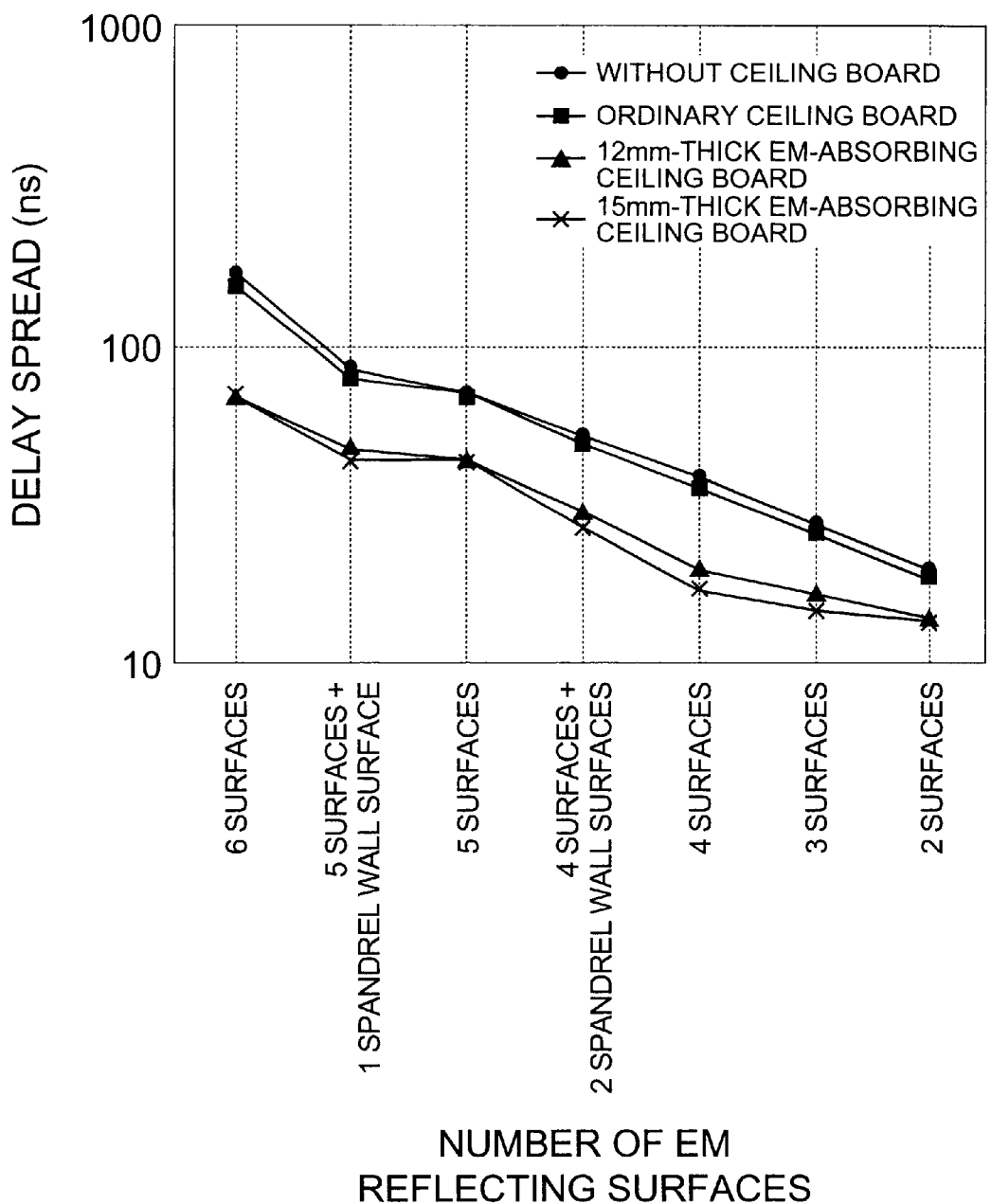
FIG. 11 is a diagram showing another relation between numbers of EM reflecting surfaces and delay spreads.

In the indoor environment design system 10 and the indoor environment evaluation system 20 according to the foregoing embodiments, the relation between delay spreads and numbers of EM reflecting surfaces under a specific condition was preliminarily obtained experimentally, as shown in FIG. 5 and FIG. 8, and the design or evaluation of indoor environment was done using it. This can be modified so that relations between numbers of EM reflecting surfaces (or numbers of EM absorbing surfaces) and delay spreads under a plurality of different conditions are preliminarily obtained experimentally, as shown in FIG. 11, and the design or evaluation of indoor environment is conducted using them. Namely, a relation between numbers of EM reflecting surfaces and delay spreads is preliminarily obtained by experiment for each of four conditions: a condition without provision of the ceiling board 7 ("without ceiling board"), a condition where the ceiling board 7 is an ordinary ceiling board with high EM reflectance ("ordinary ceiling board"), a condition where the ceiling board 7 is an EM absorbing ceiling board 12 mm thick with low EM reflectance ("12 mm-thick EM-absorbing ceiling board"), and a condition where the ceiling board 7 is an EM absorbing ceiling board 15 mm thick with extremely low EM reflectance ("15 mm-thick EM-absorbing ceiling board"); and the design or evaluation of indoor environment is performed using either one of these relations according to the condition. This enables implementation of more accurate design or evaluation of indoor environment.

The indoor environment design system 10 according to the above embodiment was the system of designing the indoor environment, and the indoor environment evaluation system 20 the system of evaluating the indoor environment. However, it is also feasible to construct an integral system as a combination of these two systems. Namely, the integral system can be constructed to allow the indoor environment evaluation system 20 to evaluate the indoor environment designed by the indoor environment design system 10 and to allow the indoor environment design system 10 to redesign the room, based on the result of the evaluation by the indoor environment evaluation system 20.

The indoor environment design system 10 or the indoor environment evaluation system 20 according to the foregoing embodiments were configured to take account of the data transfer rate and the average bit error rate as the communication quality, but the systems may be also constructed to take account of a line interruption rate, for example. The line interruption rate herein is a probability of occurrence of phenomena (line interruptions) in which, during transmission of data between communication devices connected by wire or by radio, the line is interrupted for some reason and communication is disabled. For example, where line interruptions occur at the rate of one interruption on average against 100 data communications, the line interruption rate is 1%. In the case of radio communication, line interruptions can occur in a state in which no radio waves arrive at all or when power becomes null as a result of composition of peaks and valleys of radio waves.

The indoor environment design system 10 and the indoor environment evaluation system 20 according to the foregoing embodiments took account of the delay spread as the signal propagation property, but they may also take account of a transmission loss or the like.

In the indoor environment design system 10 and the indoor environment evaluation system 20 according to the foregoing embodiments, the number of EM reflecting surfaces out of the seven surfaces of the floor surface 1, the ceiling surface 2, and the four wall surfaces 3, 4, 5, 6 was taken account of as the environment in the room, but it is also possible to further take account of furniture, partition walls, etc. placed in the room.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An indoor environment design system for designing an environment in a room for radio communication, which comprises:

target communication quality input means for inputting a target communication quality of said radio communication in said room;

first signal propagation property calculation means for calculating a signal propagation property in said room for implementation of said target communication quality, based on said target communication quality inputted by said target communication quality input means;

first signal propagation property conversion means for converting the signal propagation property in said room calculated by said first signal propagation property calculation means, to a signal propagation property in a laboratory of a specific size; and indoor environment design means for designing the environment in said room, based on the signal propagation property in said laboratory converted by said first signal propagation property conversion means and on a relation between signal propagation properties in the laboratory and environments in said laboratory for implementation of the signal propagation properties in said laboratory, which is preliminarily obtained experimentally;

wherein said first signal propagation property conversion means converts the signal propagation property in said room to the signal propagation property in said laboratory, based on comparison between a size of a space in said room and a size of a space in said laboratory.

2. The indoor environment design system according to claim 1, wherein the signal propagation property in said room is a delay spread during radio communication in said room, and wherein the signal propagation property in said laboratory is a delay spread during radio communication in said laboratory.

3. The indoor environment design system according to claim 1, wherein the environment in said room is a layout pattern of electromagnetic wave absorbing surfaces or electromagnetic wave reflecting surfaces in said room, and wherein the environments in said laboratory are layout patterns of electromagnetic wave absorbing surfaces or electromagnetic wave reflecting surfaces in said laboratory.

4. An indoor environment evaluation system for evaluating an environment in a room for radio communication, which comprises:

indoor environment input means for inputting the environment in said room;

second signal propagation property calculation means for calculating a signal propagation property in a laboratory of an environment corresponding to the environment in said room inputted by said indoor environment input means, based on a relation between environments in the laboratory of a specific size and signal propagation properties in said laboratory, which is preliminarily obtained experimentally;

second signal propagation property conversion means for converting the signal propagation property in said laboratory calculated by said second signal propagation property calculation means, to a signal propagation property in said room; and indoor environment evaluation means for evaluating the environment in said room for said radio communication, based on the signal propagation property in said room converted by said second signal propagation property conversion means;

wherein said second signal Propagation property conversion means converts the signal propagation property in said laboratory to the signal propagation property in said room, based on comparison between a size of a space in said room and a size of a space in said laboratory.

5. The indoor environment evaluation system according to claim 4, wherein the signal propagation property in said room is a delay spread during radio communication in said room, and wherein the signal propagation property in said laboratory is a delay spread during radio communication in said laboratory.

6. The indoor environment evaluation system according to claim 4, wherein the environment in said room is a layout pattern of electromagnetic wave absorbing surfaces or electromagnetic wave reflecting surfaces in said room, and wherein the environments in said laboratory are layout patterns of electromagnetic wave absorbing surfaces or electromagnetic wave reflecting surfaces in said laboratory.

7. The indoor environment evaluation system according to claim 4, wherein said indoor environment evaluation means evaluates the environment in said room by calculating a communication quality implementable in said room.

8. An indoor environment design method of designing an environment in a room for radio communication, which comprises:

a target communication quality input step of inputting a target communication quality of said radio communication in said room;

a first signal propagation property calculation step of calculating a signal propagation property in said room for implementation of said target communication quality, based on said target communication quality inputted in said target communication quality input step;

a first signal propagation property conversion step of converting the signal propagation property in said room calculated in said first signal propagation property calculation step, to a signal propagation property in a laboratory of a specific size; and an indoor environment design step of designing the environment in said room, based on the signal propagation property in said laboratory converted in said first signal propagation property conversion step and on a relation between signal propagation properties in the laboratory and environments in said laboratory for implementation of the signal propagation properties in said laboratory, which is preliminarily obtained experimentally;

wherein said first signal propagation property conversion step comprises a step of converting the signal propagation property in said room to the signal propagation property in said laboratory, based on comparison between a size of a space in said room and a size of a space in said laboratory.

9. The indoor environment design method according to claim 8, wherein the signal propagation property in said room is a delay spread during radio communication in said room, and wherein the signal propagation property in said laboratory is a delay spread during radio communication in said laboratory.

10. The indoor environment design method according to claim 8, wherein the environment in said room is a layout pattern of electromagnetic wave absorbing surfaces or electromagnetic wave reflecting surfaces in said room, and wherein the environments in said laboratory are layout patterns of electromagnetic wave absorbing surfaces or electromagnetic wave reflecting surfaces in said laboratory.

11. An indoor environment evaluation method of evaluating an environment in a room for radio communication, which comprises:

an indoor environment input step of inputting the environment in said room;

a second signal propagation property calculation step of calculating a signal propagation property in a laboratory of an environment corresponding to the environ ment in said room inputted in said indoor environment input step, based on a relation between environments in the laboratory of a specific size and signal propagation properties in said laboratory, which is preliminarily obtained experimentally;

a second signal propagation property conversion step of converting the signal propagation property in said laboratory calculated in said second signal propagation property calculation step, to a signal propagation property in said room; and an indoor environment evaluation step of evaluating the environment in said room for said radio communication, based on the signal propagation property in said room converted in said second signal propagation property conversion step;

wherein said second signal propagation property conversion step comprises a step of converting the signal propagation property in said laboratory to the signal propagation property in said room, based on comparison between a size of a space in said room and a size of a space in said laboratory.

12. The indoor environment evaluation method according to claim 11, wherein the signal propagation property in said room is a delay spread during radio communication in said room, and wherein the signal propagation property in said laboratory is a delay spread during radio communication in said laboratory.

13. The indoor environment evaluation method according to claim 11, wherein the environment in said room is a layout pattern of electromagnetic wave absorbing surfaces or electromagnetic wave reflecting surfaces in said room, and wherein the environments in said laboratory are layout patterns of electromagnetic wave absorbing surfaces or electromagnetic wave reflecting surfaces in said laboratory.

14. The indoor environment evaluation method according to claim 11, wherein said indoor environment evaluation step comprises a step of evaluating the environment in said room by calculating a communication quality implementable in said room.

* * * * *